(12) United States Patent
Ishikawa et al.

(10) Patent No.: US 11,393,084 B2
(45) Date of Patent: Jul. 19, 2022

(54) PROCESSING RECIPE GENERATION DEVICE

(71) Applicant: Hitachi, Ltd., Tokyo (JP)

(72) Inventors: Masayoshi Ishikawa, Tokyo (JP); Takeshi Ohmori, Tokyo (JP); Hyakka Nakada, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 143 days.

(21) Appl. No.: 17/043,815

(22) PCT Filed: Apr. 10, 2018

(86) PCT No.: PCT/JP2018/015042
§ 371 (c)(1),
(2) Date: Sep. 30, 2020

(87) PCT Pub. No.: WO2019/198143
PCT Pub. Date: Oct. 17, 2019

(65) Prior Publication Data
US 2021/0035277 A1 Feb. 4, 2021

(51) Int. Cl.
*G06T 7/00* (2017.01)
*H01L 21/66* (2006.01)

(52) U.S. Cl.
CPC ........... *G06T 7/001* (2013.01); *G06T 7/0004* (2013.01); *H01L 22/12* (2013.01); *H01L 22/20* (2013.01); *G06T 2207/30148* (2013.01)

(58) Field of Classification Search
CPC .............. G06T 7/001; G06T 7/0004; G06T 2207/30148; H01L 22/12; H01L 22/20
USPC ................. 382/145, 144, 149; 356/237.2
See application file for complete search history.

(56) References Cited

U.S. PATENT DOCUMENTS

| 10,426,442 | B1* | 10/2019 | Schnorr | ............... A61D 19/02 |
| 2004/0060659 | A1 | 4/2004 | Morioka et al. | |
| 2006/0064193 | A1 | 3/2006 | Yamashita et al. | |
| 2007/0053513 | A1* | 3/2007 | Hoffberg | ............ H04N 21/475 380/201 |

(Continued)

FOREIGN PATENT DOCUMENTS

| JP | 2004-119753 A | 4/2004 |
| JP | 2008-513997 A | 5/2008 |

(Continued)

OTHER PUBLICATIONS

International Search Report (PCT/ISA/210) issued in PCT Application No. PCT/JP2018/015042 dated Jul. 17, 2018 with English translation (four (4) pages).

(Continued)

*Primary Examiner* — Isiaka O Akanbi
(74) *Attorney, Agent, or Firm* — Crowell & Moring LLP

(57) ABSTRACT

An object of the present invention is to provide a technique that allows automatically generating a processing recipe from an inspection image even when the inspection image varies by being affected by an imaging condition of a processing device. A processing recipe generation device according to the present invention generates a converted image in which components relying on the imaging condition of the inspection image are reduced and generates a processing recipe using a target image generated using a conversion condition same as that of the converted image (see FIG. 2).

10 Claims, 14 Drawing Sheets

(56) References Cited

U.S. PATENT DOCUMENTS

| | | | |
|---|---|---|---|
| 2008/0159609 A1* | 7/2008 | Miyamoto | G06T 7/0006 |
| | | | 382/128 |
| 2010/0138026 A1 | 6/2010 | Kaushal et al. | |
| 2011/0235895 A1* | 9/2011 | Kitamura | G06T 7/001 |
| | | | 382/144 |
| 2017/0262735 A1 | 9/2017 | Ros Sanchez et al. | |
| 2019/0339687 A1* | 11/2019 | Celia | G05B 23/0283 |
| 2019/0354808 A1* | 11/2019 | Park | G10L 15/12 |

FOREIGN PATENT DOCUMENTS

| | | |
|---|---|---|
| JP | 2013-518449 A | 5/2013 |
| JP | 2017-162456 A | 9/2017 |

OTHER PUBLICATIONS

Japanese-language Written Opinion (PCT/ISA/237) issued in PCT Application No. PCT/JP2018/015042 dated Jul. 17, 2018 (three (3) pages).

* cited by examiner

FIG. 3

| NUMBER 301 | PROCESSING DEVICE 302 | PROCESS 303 | RECIPE 304 | INSPECTION IMAGE 305 | IMAGING CONDITION 306 |
|---|---|---|---|---|---|
| 1 | A | A' | p1 | i1 | c1 |
| 2 | A | A' | p2 | i2 | c2 |
| ⋮ | ⋮ | ⋮ | ⋮ | ⋮ | ⋮ |
| N | B | B' | pN | iN | cN |

FIG. 8

| NUMBER 801 | PROCESSING DEVICE 802 | PROCESS 803 | IMAGE CONVERSION CONDITION 804 | LEARNING MODEL 805 | LEARNING PARAMETER 806 |
|---|---|---|---|---|---|
| 1 | A | A' | r1 | m1 | t1 |
| 2 | A | A' | r2 | m2 | t2 |
| ⋮ | ⋮ | ⋮ | ⋮ | ⋮ | ⋮ |
| k | X | U' | rk | mk | tk |

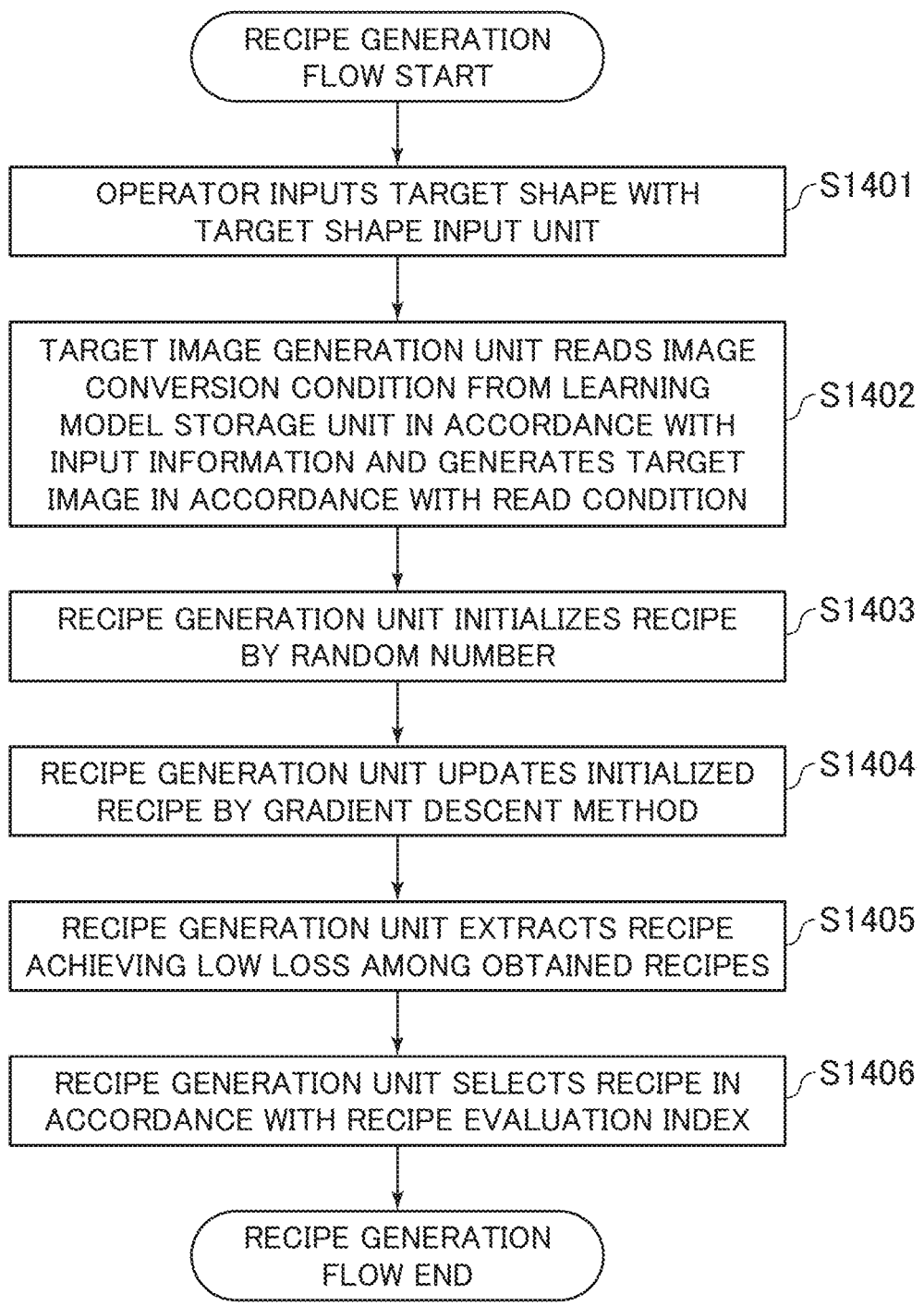

PROCESSING RECIPE GENERATION DEVICE

TECHNICAL FIELD

The present invention relates to a technique that generates a processing recipe describing an operating condition in processing an object by a processing device.

BACKGROUND ART

In association with complicated semiconductor circuit and manufacturing device, adjustment of a parameter to process a semiconductor has been difficult. This parameter is to determine a shape after the processing referred to as a recipe. Conventionally, an expert generally measures a dimension of a predetermined part and searches for a recipe with which the measured dimension becomes close to a target value. However, because of the complicated processing step, determining the part where the dimension is measured has been difficult. Therefore, a method that directly generates a recipe achieving a desired processed shape from an inspection image without relying on the determination on the part where the dimension is measured by the expert has been requested.

The following Patent Literature 1 has described a method for adjusting an oxygen flow rate or a pressure such that a Critical Dimension (CD) shift amount matches a target value.

CITATION LIST

Patent Literature

Patent Literature 1: Japanese Unexamined Patent Application Publication No. 2004-119753

SUMMARY OF INVENTION

Technical Problem

The inspection image changes its way of being imaged influenced by various noises. For example, a way of shining a light on a usual image changes the image. With the use of a Scanning Electron Microscope (SEM) used for semiconductor inspection, depending on an imaging condition, such as a degree of charge of an inspection target and an accelerating voltage, the inspection image significantly changes. Therefore, in evaluation whether it can be processed to effect the target shape, the evaluation using the inspection image itself is difficult. Accordingly, automatically generating a processing recipe using the inspection image has been difficult.

Patent Literature 1 adjusts the processing recipe according to a dimension value of a specific part. However, Patent Literature 1 does not examine an adjustment of the recipe using the inspection image itself, and further does not examine that the inspection image itself changes according to a processing condition or the imaging condition.

The present invention has been made in consideration of the above-described problems, and an object of the present invention is to provide a technique that allows automatically generating a processing recipe from an inspection image even when the inspection image varies by being affected by an imaging condition of a processing device.

Solution to Problem

A processing recipe generation device according to the present invention generates a converted image in which components relying on an imaging condition of an inspection image are reduced and generates a processing recipe using a target image generated using a conversion condition same as that of the converted image.

Advantageous Effects of Invention

With the processing recipe generation device according to the present invention, a processing recipe that achieves a desired structure can be automatically generated without a step of determining a measurement position and measuring a dimension of the position by an expert.

BRIEF DESCRIPTION OF DRAWINGS

FIG. 3 is a configuration diagram of data stored by a recipe-image storage unit 201.

FIG. 8 is a detailed configuration diagram of information stored by a learning model storage unit 205.

FIG. 14 is a flowchart describing a procedure for generating a recipe by a recipe generation unit 208.

DESCRIPTION OF EMBODIMENTS

Figure 1:
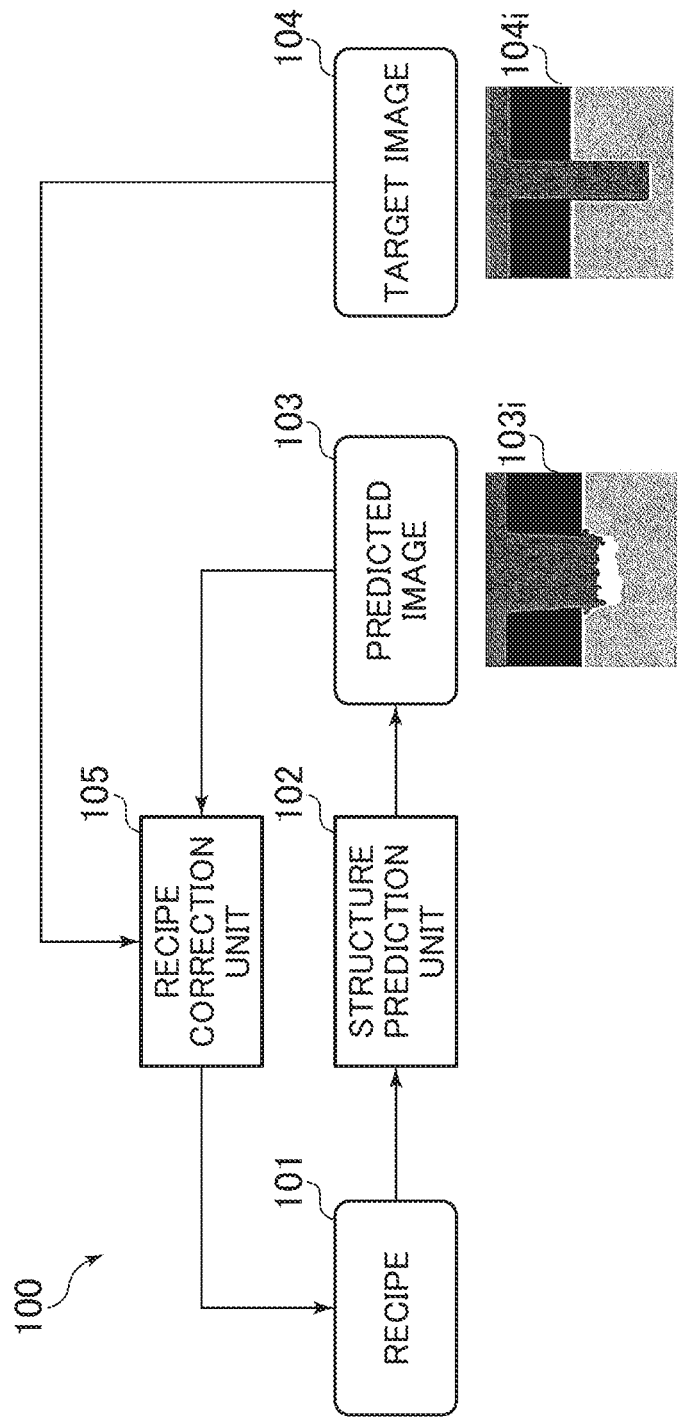
FIG. 1 is a schematic diagram describing an outline of a procedure for automatically generating a processing recipe by a processing recipe generation device 100.

FIG. 1 is a schematic diagram describing an outline of a procedure for automatically generating a processing recipe by a processing recipe generation device 100 according to the present invention. The processing recipe generation device 100 receives a recipe 101 as an input. A structure prediction unit 102 outputs a predicted image 103 representing a prediction result of a shape processed with the recipe 101. A recipe correction unit 105 corrects the recipe 101 such that the predicted image 103 becomes close to a target image 104. Repetition of this process until an ending condition is reached gradually corrects the recipe 101, thus generating the recipe 101 to output the predicted image 103 close to the target image 104. A predicted image 103*i* and a target image 104*i* are one examples of the predicted image 103 and the target image 104, respectively.

Conventionally, to generate a processing recipe, an expert designates a specific position on an inspection image, measures a dimension of the part, and generates a recipe so as to match the dimension value with a target value. However, the conventional method requires a professional know-how on the designation of the measurement position and the measurement itself, and there has been a problem that the expert is required for any work. Besides, there are the following problems: (a) Even when the same part is measured, the measurement result differs depending on a measurer; (b) Changing the position where the dimension is measured requires measurement of all pieces of past data again; (c) Parts that are not measured are not considered when the recipe is generated; and (d) A feature value, such as a curvature of the shape, difficult to be measured is present.

The present invention generates the recipe 101 achieving a structure close to the target image 104, which is an imaged target structure, to eliminate a need for measuring the dimension of the specific part and solve the problems of the conventional method.

Although the recipes 101 to achieve the target image 104 are countless, determining the recipe 101 determines a structure to be generated. Accordingly, while directly determining the recipe 101 from the target image 104 is difficult, predicting the structure from the recipe 101 is comparatively easy. Accordingly, the present invention uses the structure prediction unit 102 that outputs the predicted image 103 with the recipe 101 as the input.

A way of being imaged of the image of the inspection image changes according to various conditions. For example, a way of shining a light on a usual image changes the image. With the use of a Scanning Electron Microscope (SEM) used for semiconductor inspection, depending on an imaging condition, such as a degree of charge of an inspection target and an accelerating voltage, the inspection image significantly changes. Additionally, the image changes by, for example, a rotation and translation of a sample. Therefore, even when the target structure has been determined, the target image 104 is not uniquely determined. Accordingly, even the use of the predicted image 103 and the inspection image as the target image 104 as is, generating a good recipe is difficult.

To solve the problem, the present invention once converts the inspection image and generates the recipe using a post-conversion inspection image. Even when the change in the imaging condition varies the inspection image, such a conversion allows reducing an influence of the variation and generating the recipe in a robust manner to the variation of the inspection image. An example of the post-conversion inspection image to reduce the influence due to the variation of the imaging condition will be described later.

Figure 2:
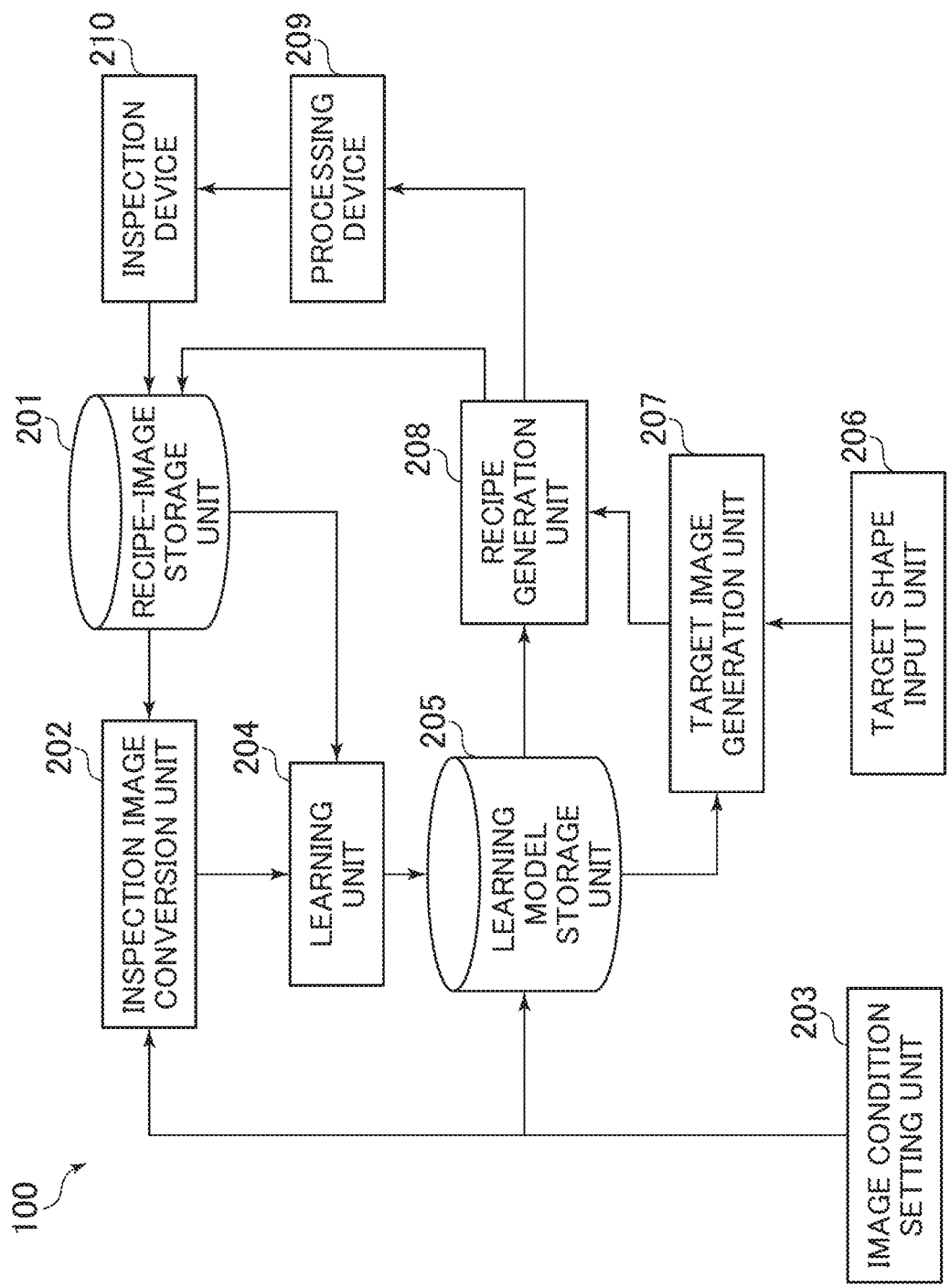
FIG. 2 is a configuration diagram of the processing recipe generation device 100.

FIG. 2 is a configuration diagram of the processing recipe generation device 100. The processing recipe generation device 100 includes a recipe-image storage unit 201, an inspection image conversion unit 202, an image condition setting unit 203, a learning unit 204, a learning model storage unit 205, a target shape input unit 206, a target image generation unit 207, a recipe generation unit 208, a processing device 209, and an inspection device 210. The outline illustrated in FIG. 1 is a process performed by the recipe generation unit 208.

The inspection image conversion unit 202 converts the inspection image stored in the recipe-image storage unit 201 according to a conversion condition set by the image condition setting unit 203. The learning unit 204 learns a model that predicts the post-conversion inspection image from the recipe using the input recipe and the post-conversion inspection image. Here, the model means the structure prediction unit 102. The leant model is stored in the learning model storage unit 205. The recipe generation unit 208 generates the recipe achieving the structure close to the target image generated by the target image generation unit 207 using the learnt model and information input to the target shape input unit 206. The processing device 209 processes the sample using the generated recipe. The inspection device 210 inspects the processed structure and outputs the inspection image (for example, a SEM observation image) representing the inspection result. A pair of the recipe generated by the recipe generation unit 208 and the inspection image output from the inspection device 210 is stored in the recipe-image storage unit 201 as new data. The above-described cycle is repeated until the processed structure achieves an index set to the target shape.

Relations between the accumulated recipes and post-conversion inspection images are learnt, the recipe to predict the structure close to the target shape is generated, and the generated recipe is actually evaluated by the processing device 209 and the inspection device 210, thus ensuring generating the recipe achieving the structure close to the target shape from the inspection image in a few cycles.

FIG. 3 is a configuration diagram of data stored by the recipe-image storage unit 201. The recipe-image storage unit 201 stores number information 301, processing device information 302, processing process information 303, recipe information 304, inspection image information 305, and imaging condition information 306.

The number information 301 holds a data number stored in the recipe-image storage unit 201. The processing device information 302 holds device information corresponding to each number. The device information is information of, for example, an ID with which an individual processing device can be identified, a model of the processing device, and the like. The processing process information 303 holds process information corresponding to each number. The process information is information with which a type of the processing performed by the processing device/process target/contents of the processing can be identified. The recipe information 304 holds recipe information corresponding to each number. The recipe information is a parameter describing contents of the processing recipe. For example, the recipe information is information, such as a current/voltage/a flow rate and a pressure of a used gas used by the processing device, and the like. The inspection image information 305 holds the inspection image corresponding to each number. The imaging condition information 306 holds the imaging condition for the inspection image corresponding to each number. For example, the imaging condition is a condition under which an influence to the inspection image possibly occurs, such as an exposure period and an accelerating voltage of an electron. The recipe information 304 and the imaging condition 306 may be a scalar quantity or may be a vector quantity. Alternatively, the recipe information 304 and the imaging condition 306 may be time series information of one or more values. The inspection image information 305 may be one piece of information or may be a plurality of pieces of information.

Figure 4:
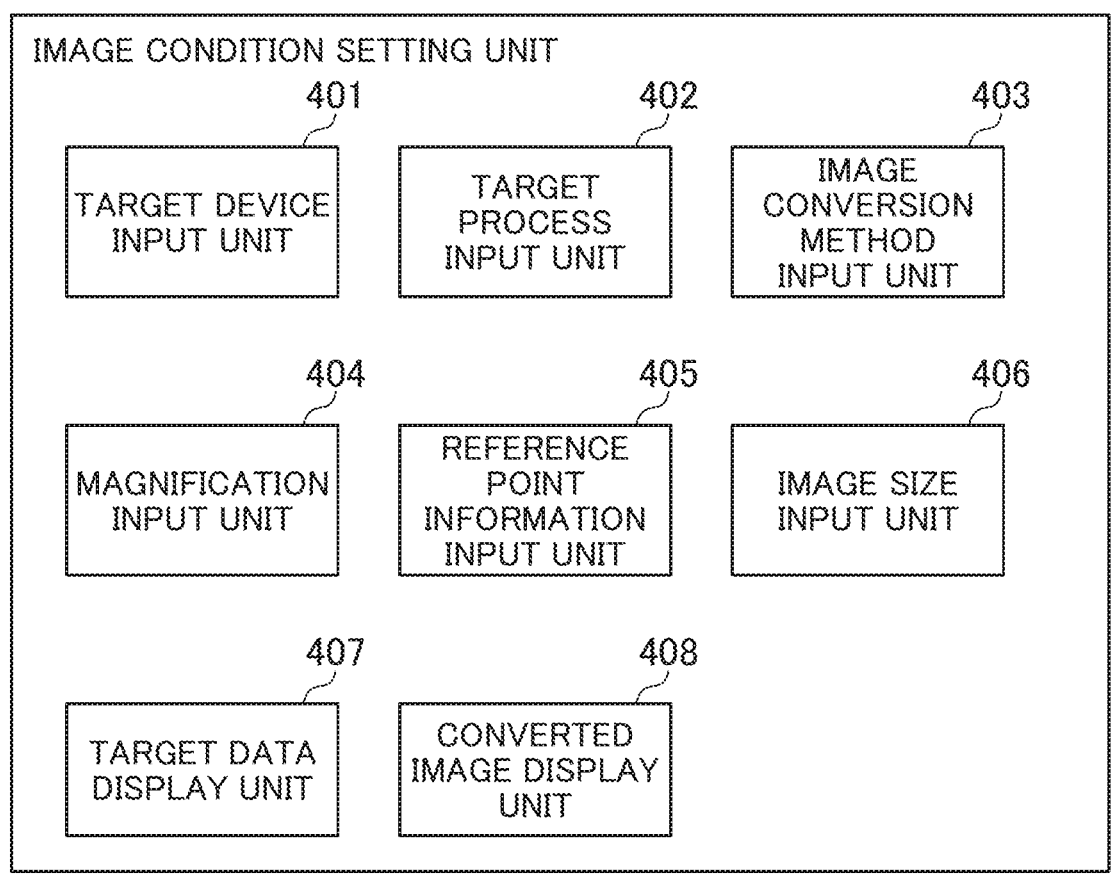
FIG. 4 is a detailed configuration diagram of an image condition setting unit 203.

FIG. 4 is a detailed configuration diagram of the image condition setting unit 203. The image condition setting unit 203 sets a condition related to image conversion used by the learning unit 204 for learning. An operator sets each conversion condition using an interface provided by the image condition setting unit 203.

The image condition setting unit 203 includes a target device input unit 401, a target process input unit 402, an image conversion method input unit 403, a magnification input unit 404, a reference point information input unit 405, an image size input unit 406, a target data display unit 407, and a converted image display unit 408.

The operator designates a device target for learning to the target device input unit 401. The device target for learning can be designated with the processing device information 302 stored by the recipe-image storage unit 201.

The operator designates the process information target for learning to the target process input unit 402. The process information can be designated with the processing process information 303 stored by the recipe-image storage unit 201.

The operator designates a method for image conversion performed by the inspection image conversion unit 202 to the image conversion method input unit 403. The image conversion method here, for example, can reduce components relying on the imaging conditions, such as semantic segmentation and various filter processes in image processing. For example, the semantic segmentation is a method used for object recognition or the like that identifies a boundary part of an image to section the image into one or more sub regions and assigns pixel values (such as luminance and a color) different depending on each sub region. This conversion allows reducing the components that vary depending on the imaging conditions in the inspection image. The operator may input a type of the image conversion method itself and its parameter to the image conversion method input unit 403, may input a program to which an image conversion process is implemented, or may select any of the image conversion methods from the preliminarily set image conversion methods.

The operator designates an image magnification after the image conversion to the magnification input unit 404. In the present invention, a comparison between the predicted image 103 and the target image 104 updates the recipe. Accordingly, unless otherwise imaging magnifications of both images are the same, generating the recipe achieving the target shape is difficult. It is preferred that the imaging magnification is maintained constant even in the post-conversion inspection image when the structure prediction unit 102 is learnt. The inspection image conversion unit 202 enlarges/reduces the image according to the magnification input to the magnification input unit 404 and the imaging condition information 306 to control the imaging magnification of the image used for the learning.

The operator designates a reference point used for the image conversion to the reference point information input unit 405. In the present invention, when the structure prediction unit 102 is learnt, the predicted image 103 is compared with the target image 104. In the comparison, it is important not to receive an influence from other than the dimension value of the structure, and therefore controlling translation/rotation similarly to the magnification is preferred. Therefore, the operator designates the reference point to the reference point information input unit 405 to match the reference point position of each inspection image with the designated position. This removes the influence from the translation/rotation. The reference point can be designated by a filter and an algorithm to detect the reference point, a position on the image to match the reference points between the inspection images, and the like. One or more reference points can be designated. One reference point can remove the influence from the translation, and the two or more reference points can remove the influences from the translation/rotation.

The operator inputs an image size used for the conversion to the image size input unit 406. The image size used for the conversion is an image size clipped from the inspection image before the conversion and the image size of the post-conversion inspection image. Matching the image sizes to a predetermined size allows stabilizing the learning.

The target data display unit 407 displays data target for learning. The data displayed by the target data display unit 407 is the recipe/inspection image corresponding to the device information/process information input to the target device input unit 401 and the target process input unit 402. The converted image display unit 408 displays the post-conversion inspection image paired with the inspection image displayed by the target data display unit 407.

Figure 5:
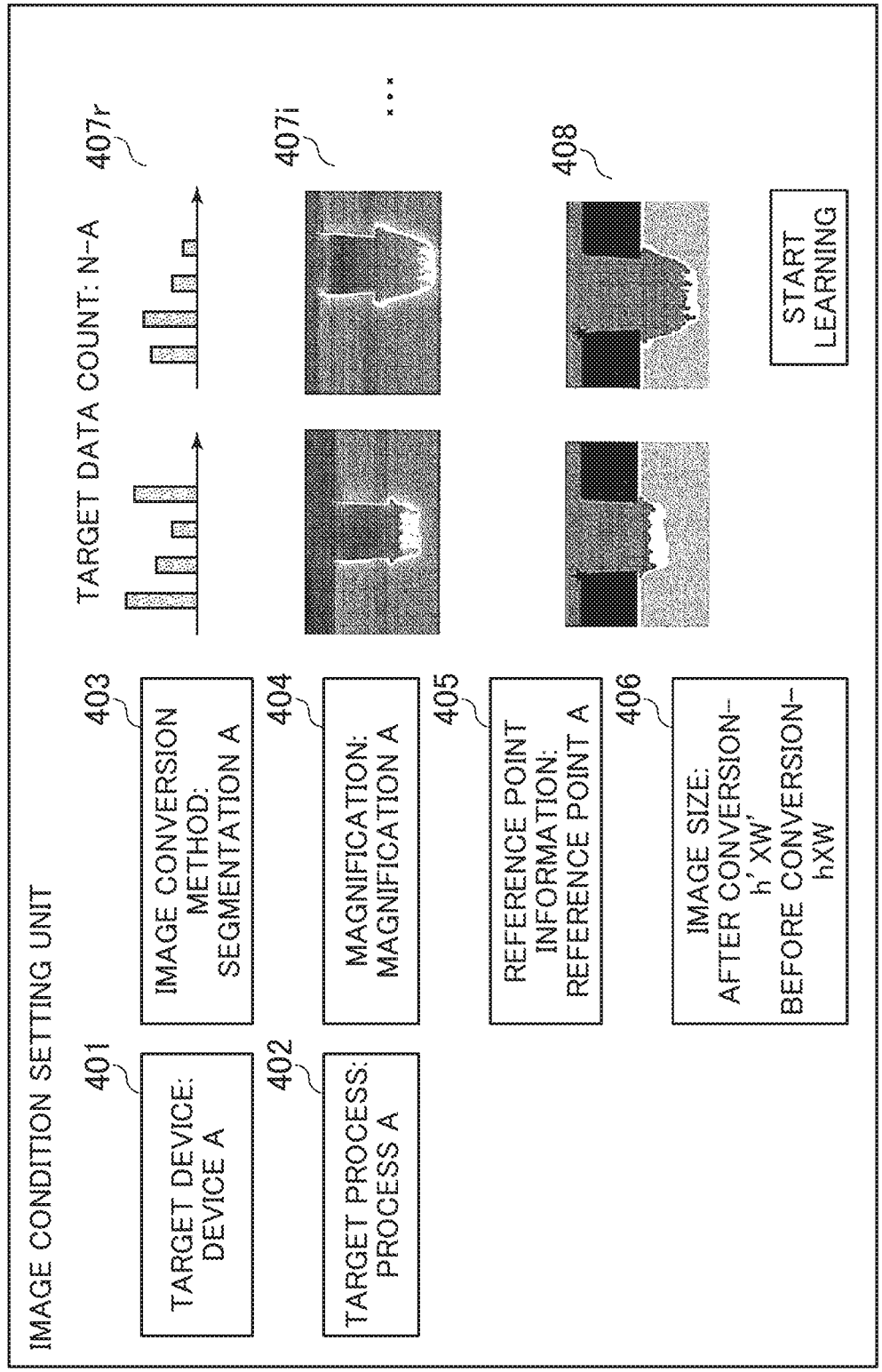
FIG. 5 is one example of an interface provided by the image condition setting unit 203.

FIG. 5 is one example of an interface provided by the image condition setting unit 203. The operator designates the following information to each unit. To the target device input unit 401, the device target for learning is input. To the target process input unit 402, the process target for learning is input. To the image conversion method input unit 403, the image conversion method is input. To the magnification input unit 404, the magnification is input. To the reference point information input unit 405, the reference point is input. To the image size input unit 406, the image size is input.

Based on the information input by the operator, the target data display unit 407 displays the learning target data (407r, 407i), and the converted image display unit 408 displays the post-conversion inspection image. 407r are the recipe information of the target data, and 407i are the inspection images of the target data. The inspection images 407i displayed here are images before the conversion, and there may be a case where the magnifications are different and/or the reference points are not matched to the same position on the images. Since the converted image display unit 408 displays the image on which the image conversion has been performed and whose magnification/reference point/image size have been adjusted, as long as the same structure, the same image is displayed. Additionally, since the change in the image is equal to the change in the structure, a relation between the recipe and the structure can be directly learnt. The converted image display unit 408 may display the reference point position on the image together.

Figure 6:
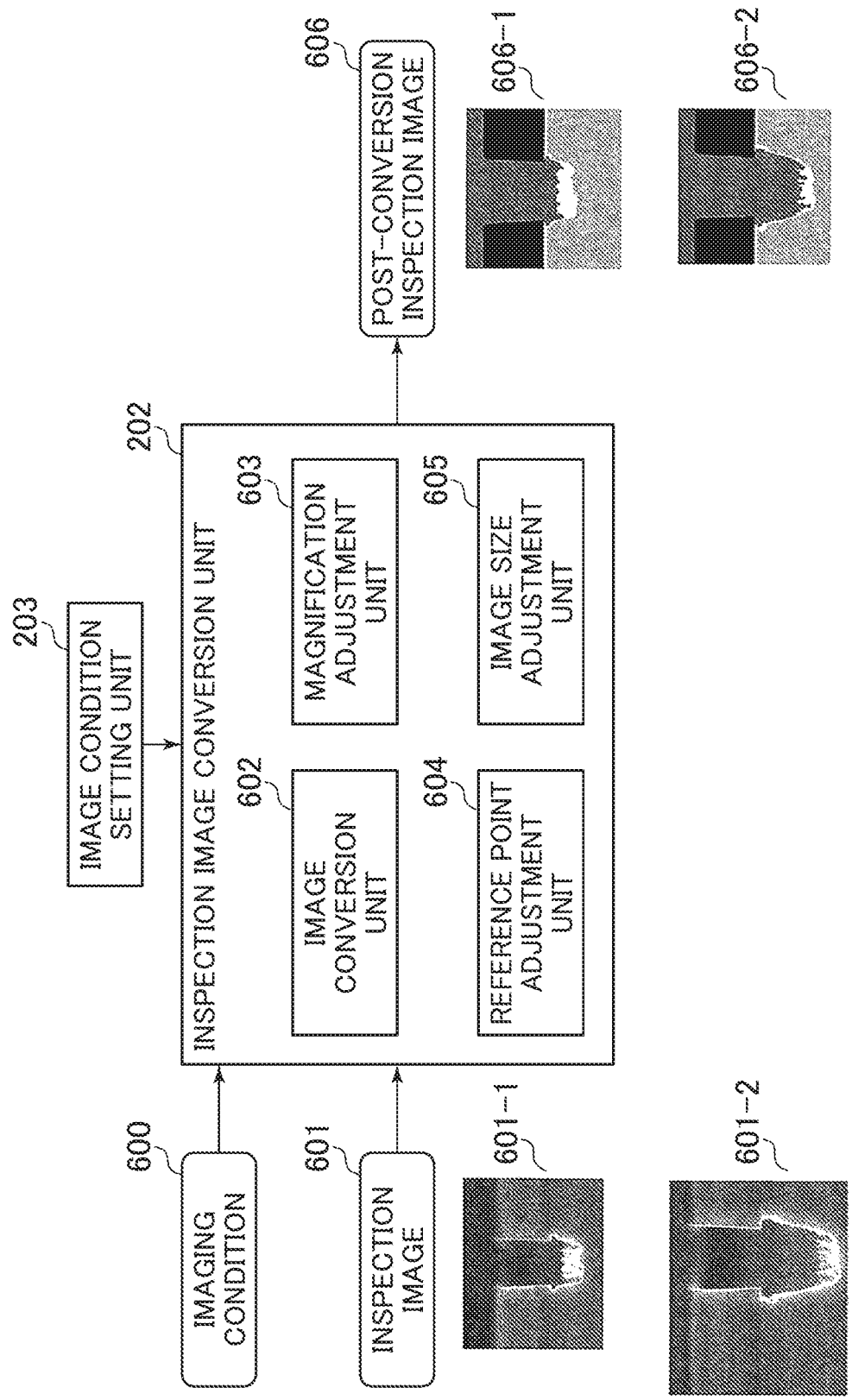
FIG. 6 is a detailed configuration diagram of an inspection image conversion unit 202.

FIG. 6 is a detailed configuration diagram of the inspection image conversion unit 202. The inspection image conversion unit 202 includes an image conversion unit 602, a magnification adjustment unit 603, a reference point adjustment unit 604, and an image size adjustment unit 605. The inspection image conversion unit 202 generates a post-conversion inspection image 606 using an imaging condition 600 and an inspection image 601. Each of 601-1 and 601-2 are one example of the inspection image 601, and each of 606-1 and 606-2 are one example of the post-conversion inspection image 606. The imaging condition 600 and the inspection image 601 are extractions of data corresponding to the device information and the process information set in the image condition setting unit 203 among the inspection image information 305 and the imaging condition 306 stored in the recipe-image storage unit 201.

The image conversion unit 602 converts the inspection image such that dependency to a state of a light or an electron beam is reduced. Here, an example of using the semantic segmentation as the conversion method will be described. The semantic segmentation is a process that converts images having continuous luminance values, such as the images 606-1 and 606-2, into images having non-continuous pixel values, such as the images 606-1 and 606-2. Here, air space/mask/silicon/roughness parts in the inspection image are each shown by differ pixel values. Thus, the discrete value different depending on each region is provided in the inspection image. While an example of the classification into the four classes of the air space/mask/silicon/roughness has been described here, an appropriate class can be set according to the content of the inspection image. As a method for implementing the semantic segmentation, for example, Convolutional Neural Networks (CNN), such as Fully Convolutional Neural Networks, can be used.

The magnification adjustment unit 603 adjusts the magnification such that the imaging magnification of the post-conversion inspection image 606 becomes constant. The magnification adjustment unit 603 receives the imaging condition 600 and the inspection image 601 as inputs, reads the imaging magnification of each inspection image 601 from the imaging condition 600 corresponding to each inspection image 601, and enlarges/reduces the image so as to match the imaging magnification set in the image condition setting unit 203.

The reference point adjustment unit 604 and an image size adjustment unit 605 perform a process such that the image after adjusting the magnification has the same image size and the reference point position is matched to the same position. This can be performed by, for example, detecting the reference point from the image and clipping the region predetermined with the reference point as the reference.

Figure 7:
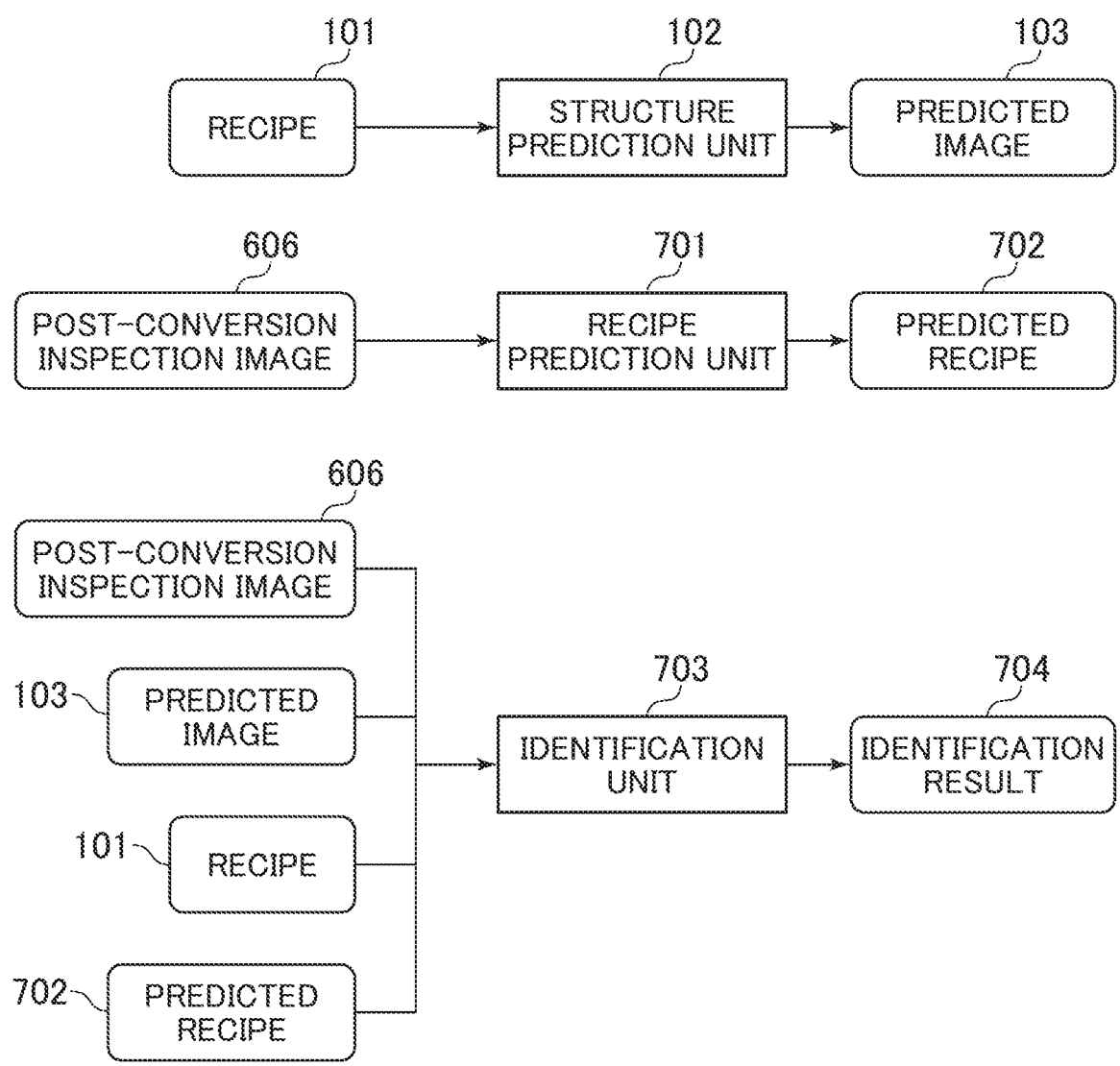
FIG. 7 is a schematic diagram illustrating a learning process performed by a learning unit 204.

FIG. 7 is a schematic diagram illustrating the learning process performed by the learning unit 204. The learning unit 204 learns the structure prediction unit 102 to predict the post-conversion inspection image from the recipe 101 and stores the learning result in combination with the learning condition in the learning model storage unit 205. The learning unit 204 includes the structure prediction unit 102, a recipe prediction unit 701, and an identification unit 703.

The learning unit 204 learns the structure prediction unit 102 using a method referred to as Generative Adversarial Networks (GAN). The GAN is a method that attempts to correctly identify a given image by an identifier, attempts to generate an image fooling the identifier by a generator, and advances the learning while causing both to be opposed to one another to advance the learning such that a further highly accurate image is generated. In the configuration of FIG. 7, the identification unit 703 determines whether the given pair of the image and the recipe is in a correct combination, and the structure prediction unit 102 outputs the predicted image 103 having accuracy to the extent that the identification unit 703 recognizes the pair as the correct combination. The learning is repeated such that the identification unit 703 increases identification accuracy and the learning is repeated such that the structure prediction unit 102 outputs the predicted image 103 with further high accuracy, and thus the learning as the entire learning unit 204 proceeds. The following describes an operation by each unit.

The structure prediction unit 102 outputs the predicted image 103 with the recipe 101 as the input. The recipe prediction unit 701 outputs a predicted recipe 702 with the post-conversion inspection image 606 as the input. The identification unit 703 receives the pair of the image and the recipe as the input and determines whether the pair is the correct combination. Specifically, the identification unit 703 receives any one of the post-conversion inspection image 606 and the predicted image 103 as the input image, receives any one of the recipe 101 and the predicted recipe 702 as an input recipe, and outputs an identification result 704 indicative of whether these are the correct combination.

The structure prediction unit 102/recipe prediction unit 701/identification unit 703 can be implemented by, for example, a neural network. The neural network optimizes the parameters so as to minimize losses to advance the learning. In FIG. 7, the following losses are considered.

Loss 11: A loss between the predicted image 103 and the post-conversion inspection image 606 (paired with the recipe 101). This is mainly used to learn the structure prediction unit 102.

Loss 12: A loss between the predicted recipe 702 and the recipe 101 (paired with the post-conversion inspection image 606). This is mainly used to learn the recipe prediction unit 701.

Loss 112: A loss between the predicted recipe 702 and the recipe 101 where the predicted image 103 generated with the recipe 101 as the input is used as the input of the recipe prediction unit 701 to generate the predicted recipe 702. When the learning appropriately progresses, the predicted recipe 702 generated as described above is expected to return to the recipe 101, and therefore this loss 112 has been determined to be used as an evaluation index for learning.

Loss 121: A loss between the predicted image 103 and the post-conversion inspection image 606 where the predicted recipe 702 generated with the post-conversion inspection image 606 as the input is used as the input of the structure prediction unit 102 to generate the predicted image 103. When the learning appropriately progresses, the predicted image 103 generated as described above is expected to return to the post-conversion inspection image 606, and therefore this loss 121 has been determined to be used as an evaluation index for learning.

Loss 13: A loss for evaluation whether the identification result 704 shows the correct identification result.

Loss 14: A loss to avoid the learning result to be biased. For example, a gradient of the input of the identification unit 703 can be the loss 14.

The structure prediction unit 102 updates the parameters so as to minimize l1, 112, 121, and the negative l3. The recipe prediction unit 701 updates the parameters so as to minimize l2, 112, 121, and the negative l3. The identification unit 703 updates the parameters so as to minimize l3 and l4.

Although the use of only the structure prediction unit 102 is enough to generate the recipe, the recipe prediction unit 701 and the identification unit 703 are used together for learning of the structure prediction unit 102 using the GAN. The identification unit 703 learns that only when the input is the correct pair of the post-conversion inspection image 606 and the recipe 101, the identification result 704 indicative of the fact is output. That is, the identification unit 703 learns the correct combination between the input recipe and image. The structure prediction unit 102 and the recipe prediction unit 701 advance the learning so as to output the respective predicted image 103 and predicted recipe 702 with accuracy by which the identification unit 703 misrecognizes that the pair is the correct combination. By these interactions, the structure prediction unit 102 learns to output the correct combination of the recipe 101 and the predicted image 103, and the recipe prediction unit 701 learns to output the correct combination of the post-conversion inspection image 606 and the predicted recipe 702.

The structure prediction unit 102 and the recipe prediction unit 701 are expected to predict the respective post-conversion inspection image 606 and recipe 101 as the correct combination from the input recipe 101 and post-conversion inspection image 606. At this time, it is preferred that the predicted recipe 702 obtained by inputting the predicted image 103 output by the structure prediction unit 102 with the recipe 101 as the input to the recipe prediction unit 701 becomes equal to the recipe 101 as the original input. Similarly, it is preferred that the predicted image 103 obtained by inputting the predicted recipe 702 output by the recipe prediction unit 701 with the post-conversion inspection image 606 as the input to the structure prediction unit 102 becomes equal to the post-conversion inspection image 606 as the original input. Accordingly, minimizing the losses 112 and 121 corresponding to them has an effect of assisting the learning of the structure prediction unit 102.

FIG. 8 is a detailed configuration diagram of information stored by the learning model storage unit 205. The learning model storage unit 205 holds model number information 801, processing device information 802, process information 803, image conversion condition information 804, learning model information 805, and learning parameter information 806.

The model number information 801 is a number of the learning model stored in the learning model storage unit 205. The processing device information 802 holds information on the processing device learnt by each learning model. The process information 803 holds information on the process learnt by each learning model. The image conversion condition information 804 holds an image conversion condition used when each learning model is learnt. The learning model information 805 holds information on each learning model. The information on the learning model is, for example, a process content by the structure prediction unit 102 and a parameter used at the time. The process is, for example, a layer structure of the neural network, and the parameter is a weighted matrix and a bias term of the neural network. The learning model held by the learning model information 805 may include the recipe prediction unit 701 and the identification unit 703, in addition to the structure prediction unit 102. Furthermore, a value of the loss achieved by each learning model may be stored at the end of the learning. The learning parameter information 806 holds the parameter used when each learning model is learnt. For example, any parameter affecting the learning including a type of an optimizer, a learning proportion, a learning count, and a batch size can be held.

Figure 9:
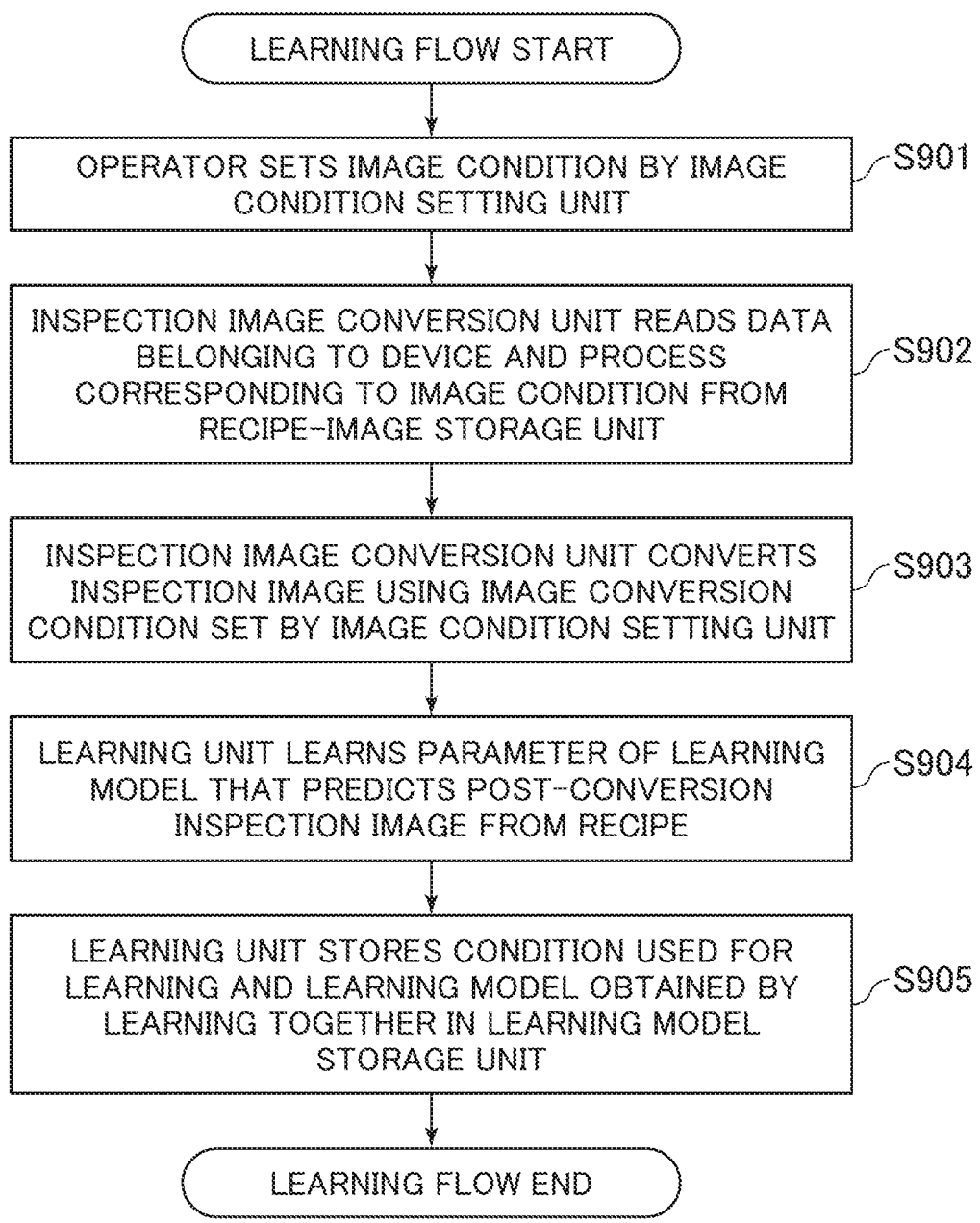
FIG. 9 is a flowchart describing a procedure for learning by the learning unit 204.

FIG. 9 is a flowchart describing a procedure for learning by the learning unit 204. At Step S901, the operator sets the learning condition via the image condition setting unit 203. At Step S902, the inspection image conversion unit 202 reads the device information and the process information corresponding to the learning condition set by the image condition setting unit 203 from the recipe-image storage unit 201. At Step S903, the inspection image conversion unit 202 converts the inspection image using the image conversion condition set by the image condition setting unit 203 to generate the post-conversion inspection image 606. At Step S904, the learning unit 204 reads the recipe information corresponding to the device and the process corresponding to the learning condition from the recipe-image storage unit 201 and reads the post-conversion inspection image 606 from the inspection image conversion unit 202 to learn the structure prediction unit 102 that predicts the post-conversion inspection image 606 from the recipe 101. At this step, the recipe 101 and the post-conversion inspection image 606 to be read are held to be in the combination having the same number information 301 in the recipe-image storage unit 201. At Step S905, the learning unit 204 stores the condition used for the learning and the learning model obtained through the learning in the learning model storage unit 205.

The learning process of FIG. 9 is performed at a predetermined timing, such as a timing when the operator starts the learning flow and a timing when the data in the recipe-image storage unit 201 related to the learning condition is updated. Before that recipe is generated, the learning model may be stored in the learning model storage unit 205 and necessary information may be used from the learning model storage unit 205 when the recipe is generated, or the learning model may be learnt successively when the recipe is generated.

Figure 10:
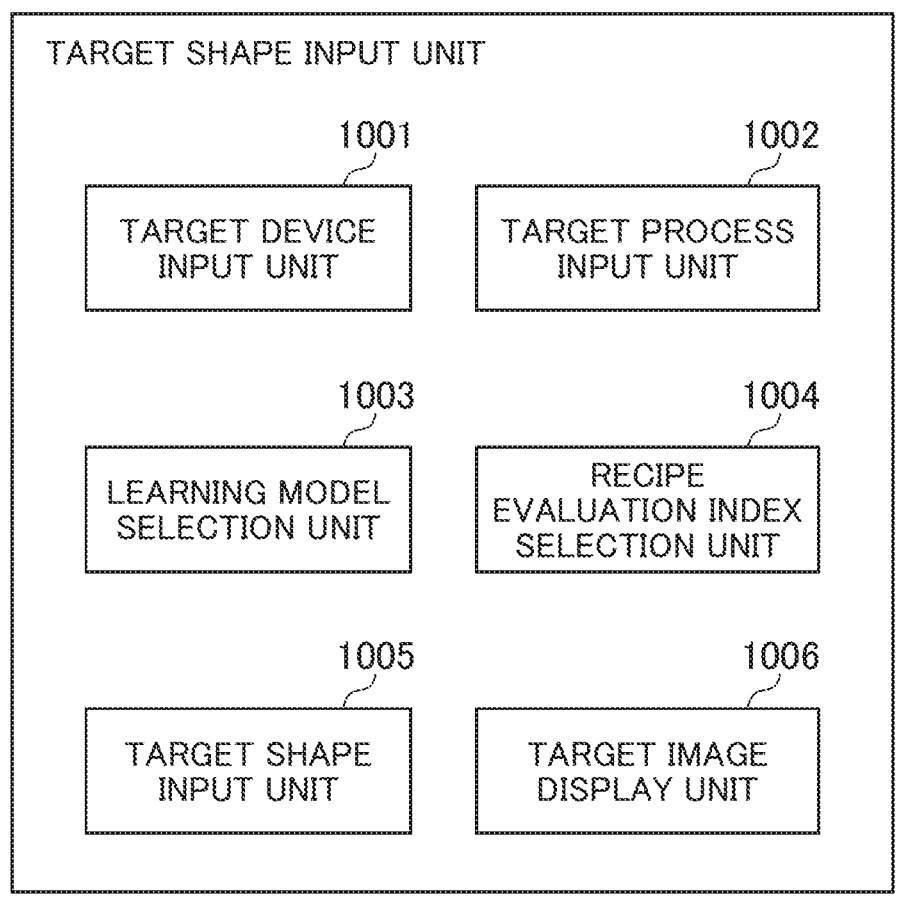
FIG. 10 is a configuration diagram of a target shape input unit 206.

FIG. 10 is a configuration diagram of the target shape input unit 206. The target shape input unit 206 provides an interface to which the operator inputs the target shape obtained by the processing. The target shape input unit 206 includes a target device input unit 1001, a target process input unit 1002, a learning model selection unit 1003, a recipe evaluation index selection unit 1004, a target shape input unit 1005, and a target image display unit 1006.

The operator inputs the information on the target device for generating the recipe to the target device input unit 1001. The information similar to the processing device information 802 stored in the learning model storage unit 205 can be input.

The operator inputs the information on the target process for generating the recipe to the target process input unit 1002. The information similar to the process information 803 stored in the learning model storage unit 205 can be input.

The operator selects the learning model used to generate the recipe via the learning model selection unit 1003. The information similar to the learning model information 805 stored in the learning model storage unit 205 can be input.

The operator selects a recipe evaluation index via the recipe evaluation index selection unit 1004. Since the recipes achieving the structure close to the target structure are countless, the index to select the appropriate recipe among them is required. The operator selects the evaluation index via the recipe evaluation index selection unit 1004. As the evaluation index, for example, a gradient minimum index and a loss minimum index can be used. An example of these indexes will be described with reference to FIG. 13.

The operator inputs a target shape value to the target shape input unit 1005. For example, the dimension value of each part may be input as the target shape, or design data of the target structure may be input.

The target image display unit 1006 displays the target image 104 generated by the target image generation unit 207 using the target shape value input to the target shape input unit 1005.

Figure 11:
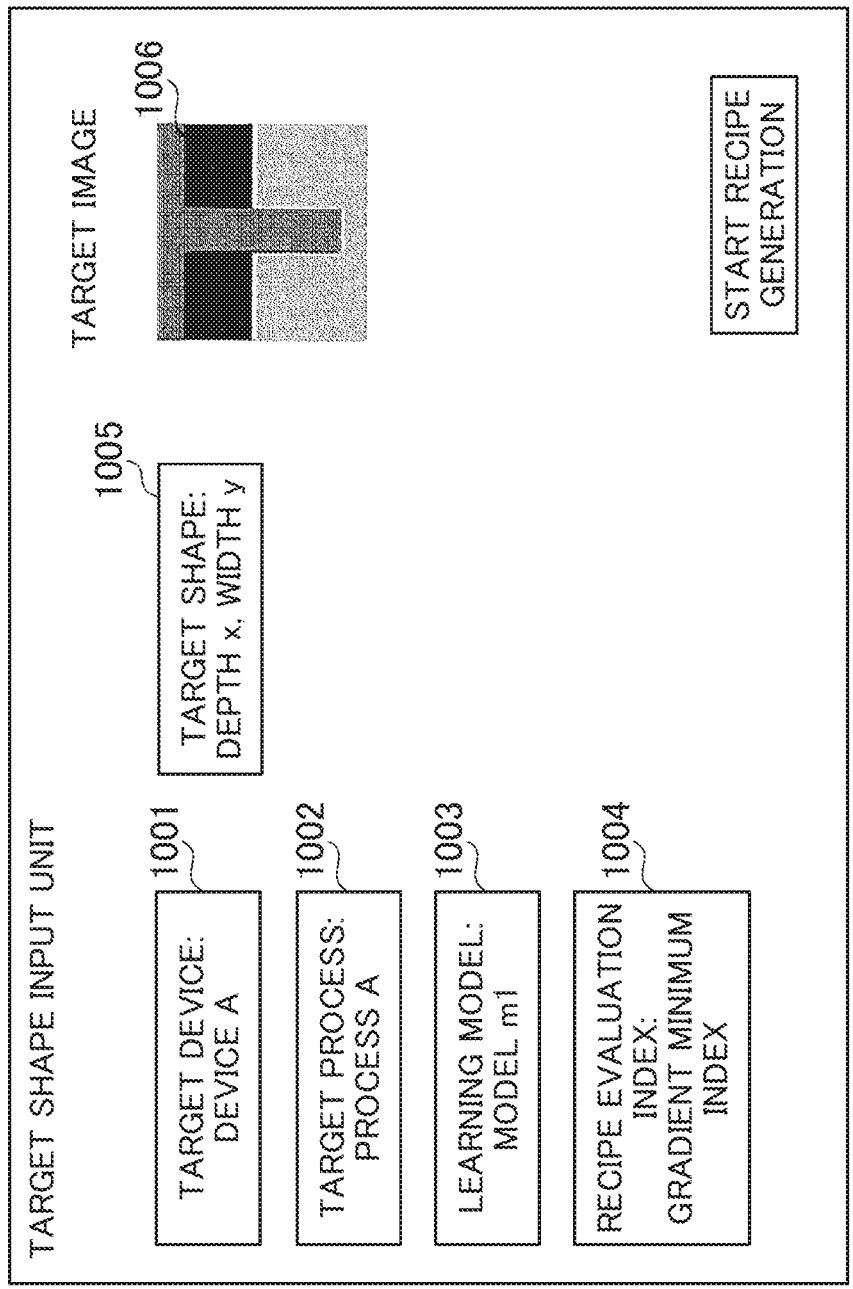
FIG. 11 is a screen example of the target shape input unit 206.

FIG. 11 is a screen example of the target shape input unit 206. The operator designates the following information to each unit. The device of the recipe generating target is input to the target device input unit 1001. The process of the recipe generating target is input to the target process input unit 1002. The learning model selection unit 1003 selects the learning model used to generate the recipe. The recipe evaluation index selection unit 1004 selects the evaluation index used to generate the recipe. The target shape is input to the target shape input unit 1005. When the data are input, the target image generation unit 207 generates the target image in accordance with the input information, and the target image display unit 1006 displays the generated target image.

Figure 12:
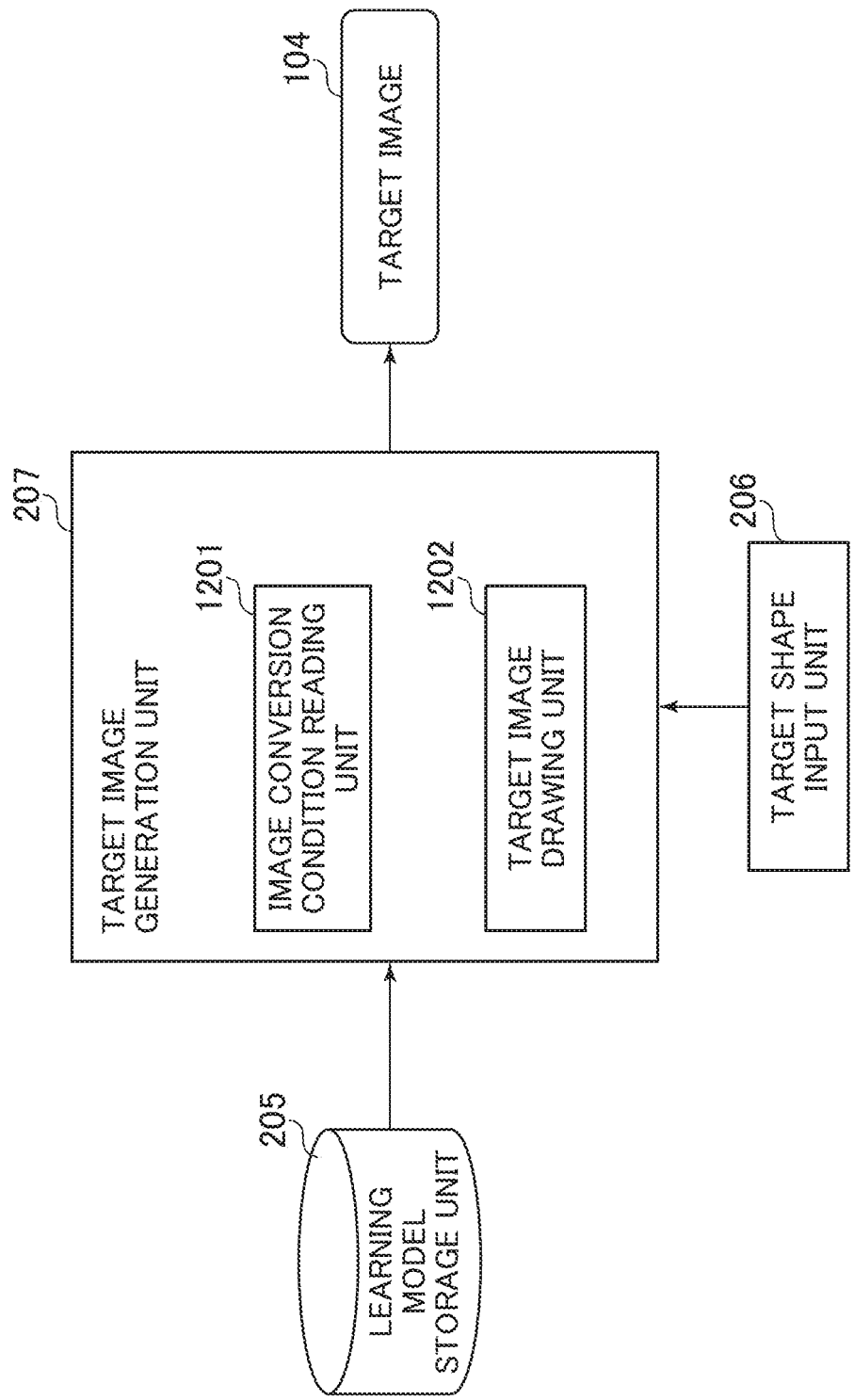
FIG. 12 is a detailed configuration diagram of a target image generation unit 207.

FIG. 12 is a detailed configuration diagram of the target image generation unit 207. The target image generation unit 207 includes an image conversion condition reading unit 1201 and a target image drawing unit 1202.

The image conversion condition reading unit 1201 reads the image conversion condition corresponding to the learning model selected in the target shape input unit 206 from the learning model storage unit 205. The target image drawing unit 1202 draws the target image 104 according to the read image conversion condition and outputs the target image 104.

Figure 13:
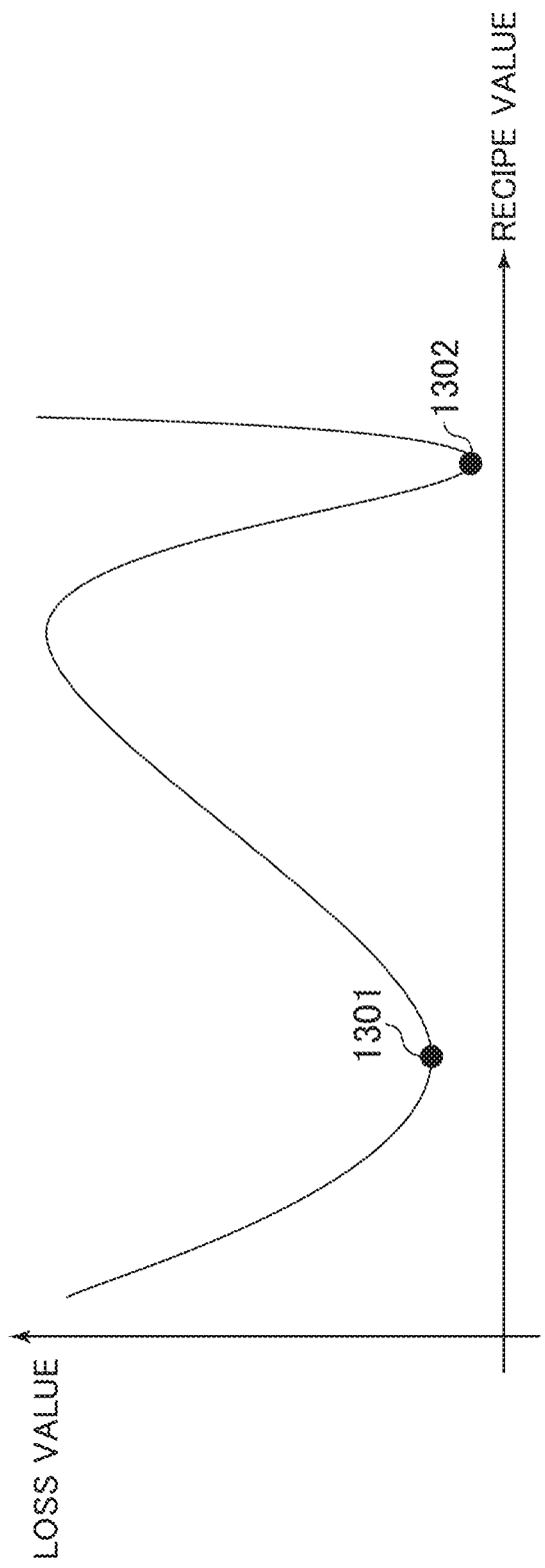
FIG. 13 is an outline diagram of a recipe evaluation index.

FIG. 13 is an outline diagram of the recipe evaluation index. Here, it is assumed that the recipe is described by one-dimensional data for simplification, the following procedure is similar to the case where the recipe is multidimensional. The horizontal axis plots a parameter value indicative of the content of the recipe. The vertical axis plots the loss between the predicted image 103 and the target image 104 obtained by the structure prediction unit 102 with the recipe. The loss is, for example, an L1 error or the like. Hereinafter, a procedure for searching for the recipe achieving the target shape will be described using FIG. 13.

Since the recipes achieving the target structure are countless, by changing the recipe value, the loss value has a plurality of local minimal values. In FIG. 13, two local minimal values 1301 and 1302 are present. A loss minimum index is an index to select the local minimal value achieving the smallest loss value. In the case of FIG. 13, the loss minimum index selects the local minimal value 1302. A gradient minimum index is an index to select the local minimal value where a gradient around the local minimal value becomes the minimum. In the case of FIG. 13, the local minimal value 1301 is selected. Since the loss minimum index has the smallest loss value, a recipe that is more likely to achieve the target structure is selected. The gradient minimum index is to select a recipe tough against the state change in the recipe and the device.

As illustrated in FIG. 13, the variation of the loss value is small around the local minimal value 1301. Therefore, since the loss value does not significantly change around the local minimal value 1301 even when a noise is mixed with the recipe and the device state, the predicted structure is tough against these noises. Therefore, in the actual processing, it can be expected that the processed structure is tough against these noises. In contrast to this, the loss value significantly changes by a slight variation of the recipe around the local minimal value 1302. Accordingly, it can be predicted that the processing result is more likely to significantly vary due to an influence of the noise around the local minimal value 1302.

FIG. 14 is a flowchart describing the procedure for generating the recipe by the recipe generation unit 208. At Step S1401, the operator inputs the target shape via the target shape input unit 206. At Step S1402, the target image generation unit 207 reads the image conversion condition from the learning model storage unit 205 in accordance with the information input to the target shape input unit 206 and generates the target image 104. At Step S1403, the recipe generation unit 208 initializes the recipe by generating it using a random number. At this time, a plurality of recipes are generated. At Step S1404, the recipe generation unit 208 updates the initialized recipe by gradient descent method. Specifically, as illustrated in FIG. 1, the recipe 101 is input to the structure prediction unit 102, the loss between the output predicted image 103 and target image 104 (for example, the L1 error) is calculated, error backpropagation is performed on the obtained loss to obtain the gradient of the recipe and updates the recipe by gradient descent method. This recipe is updated until a converge condition, such as a predetermined count or a quantity of update of the recipe becoming a predetermined threshold or less, is met. Since the obtained recipe depends on the initial value in the recipe generation by gradient descent method, generating the plurality of recipes at Step S1403 allows obtaining recipes achieving a plurality of loss local minimal values. At Step S1405, the recipe generation unit 208 extracts the recipe achieving the low loss among the plurality of obtained recipes. Step S1405 can be performed by, for example, extracting a predetermined count of recipes in an order of low loss with the target image 104 among the obtained recipes, extracting the recipes by a predetermined proportion in an order of the lowest loss with the target image 104 among the obtained recipes, extracting a recipe achieving a loss within a predetermined range, or the like. With the use of the gradient descent method, since the recipe in which the obtained loss is comparatively high is obtained depending on the generated recipe in some cases, extracting the recipe achieving the good loss value to some extent is a purpose of Step S1405. At Step S1406, the recipe generation unit 208 selects the recipe with the high recipe evaluation index selected by the target shape input unit 206 among the recipes extracted at Step S1405 and outputs the recipe.

<Summary of the Present Invention>

The processing recipe generation device 100 according to the present invention allows automatically generating the recipe achieving the structure close to the target structure as much as possible only from the recipe and the inspection image without performing the step of designating the measurement position on the inspection image or measuring the dimension by the expert. Additionally, since the recipe can be generated without relying on the dimension value of the specific part, the further excellent recipe can be generated.

<Modifications of the Present Invention>

The present invention is not limited to the above-described embodiments but includes various modifications. For example, the above-described embodiments have been described in detail for easy understanding of the present invention, and therefore, it is not necessarily limited to include all described configurations. It is possible to replace a part of the configuration of a certain embodiment with a configuration of another embodiment, and it is possible to add a configuration of another embodiment to a configuration of a certain embodiment. Additionally, addition, removal, or replacement of another configuration is possible to a part of the configuration of each embodiment.

While the example of semiconductor manufacturing equipment has been described above, other various applications are considered. Since the present invention features the direct learning of the relation between the inspection image and the parameter of the processing device, the present invention is also applicable to, for example, machine component processing or the like that can control the inspection image and the parameter of the processing device.

While the description that the inspection image conversion unit 202 converts the image using the semantic segmentation to reduce the components on the image relying on the imaging conditions has been given above, as long as the similar effect can be provided, another method can be used. For example, a method, such as a decrease in a gradation of the image or an increase in sharpness, is considered. A plurality of methods can be used together.

While the use of GAN to learn the correspondence relation between the recipe 101 and the post-conversion inspection image 606 by the learning unit 204 has been described above, the learning may be performed by another appropriate method. Additionally, the learning method other than the neural network may be used.

LIST OF REFERENCE SIGNS 100 processing recipe generation device
101 recipe
102 structure prediction unit
103 predicted image
104 target image 105 recipe correction unit
201 recipe-image storage unit
202 inspection image conversion unit
203 image condition setting unit
204 learning unit
205 learning model storage unit
206 target shape input unit
207 target image generation unit
208 recipe generation unit
209 processing device
210 inspection device

The invention claimed is:

1. A processing recipe generation device that generates a processing recipe, the processing recipe describing an operating condition of the processing device when the processing devices processes an object, the processing recipe generation device comprising:
a storage unit configured to store the processing recipe of the processing device, an inspection image, and a correspondence relation between the processing recipe and the inspection image, the object processed by the processing device using the processing recipe being captured in the inspection image;
an inspection image conversion unit configured to generate a converted image, the converted image being generated by converting the inspection image using a conversion condition to reduce components relying on an imaging condition of the inspection image among components that the inspection image has;
a learning unit configured to learn the relation between the processing recipe and the converted image;
a target shape input unit configured to input a target shape processed by the processing device;
a target image generation unit configured to generate a target image, the target image being generated by converting an image representing the target shape in accordance with the conversion condition using a learning result by the learning unit; and
a recipe generation unit configured to generate a target processing recipe used to process a shape represented by the target image.

2. The processing recipe generation device according to claim 1, wherein
the inspection image conversion unit is configured to divide the inspection image into one or more sub regions, and the inspection image conversion unit is configured to provide pixel values different depending on each of the sub regions to generate the converted image.

3. The processing recipe generation device according to claim 1, wherein
the target image generation unit is configured to generate the target image divided into one or more sub regions and having pixel values different depending on each of the sub regions.

4. The processing recipe generation device according to claim 1, wherein
the learning unit includes a first predictor, and the first predictor is configured to receive the processing recipe as an input and predict a predicted conversion image corresponding to the input processing recipe based on the result of learning the relation between the processing recipe and the converted image.

5. The processing recipe generation device according to claim 4, wherein
the learning unit includes:
a second predictor configured to receive the converted image as an input, the second predictor being configured to predict a predicted processing recipe corresponding to the input converted image based on the result of learning the relation between the processing recipe and the converted image; and
an identifier configured to receive the processing recipe or the predicted processing recipe as an input and receive the converted image or the predicted converted image as an input, the identifier being configured to identify whether the input recipe and the input image are in a correct combination, and
the learning unit is configured to cause the first predictor to learn so as to output the predicted conversion image by which the identifier outputs an incorrect identification result, the learning unit is configured to cause the second predictor to learn so as to output the predicted processing recipe by which the identifier outputs an incorrect identification result, and the learning unit is configured to repeatedly cause the identifier to learn such that the identifier outputs a correct identification result to learn the relation between the processing recipe and the conversion image.

6. The processing recipe generation device according to claim 5, wherein
the first predictor and the second predictor are configured to perform learning such that a result of prediction by receiving the predicted converted image as an input by the second predictor matches the processing recipe, and
the first predictor and the second predictor are configured to perform learning such that a result of prediction by receiving the predicted processing recipe as an input by the first predictor matches the converted image.

7. The processing recipe generation device according to claim 4, wherein
the recipe generation unit is configured to search for a processing recipe with which a difference between the predicted converted image and the target image becomes small as much as possible from a processing recipe candidate group to generate the target processing recipe.

8. The processing recipe generation device according to claim 7, wherein
the recipe generation unit is configured to employ a processing recipe with which the difference becomes a local minimum or a processing recipe with which a changing rate of the difference becomes a local minimum as the target processing recipe.

9. The processing recipe generation device according to claim 1, further comprising
a condition setting unit configured to designate a conversion condition when the inspection image conversion unit converts the inspection image.

10. The processing recipe generation device according to claim 9, wherein
the condition setting unit is configured to designate, as the conversion conditions:
an imaging magnification of the converted image;
an image size of the converted image; and
a reference point of positioning between the inspection image and the converted image, and
the target image generation unit is configured to generate the target image such that the imaging magnification of the target image, the image size of the target image, and the reference point in the target image match the imaging magnification of the converted image, the image size of the converted image, and the reference point of the positioning between the inspection image and the converted image designated by the condition setting unit, respectively.

\* \* \* \* \*